US005590028A

United States Patent [19]

Duncan

[11] Patent Number: 5,590,028
[45] Date of Patent: Dec. 31, 1996

[54] MEMORY CARD ASSEMBLY HAVING IMPROVED MEANS FOR GROUNDING PRINTED WIRING BOARD AND METHOD OF USE

[75] Inventor: Paul M. Duncan, Durham, N.C.

[73] Assignee: Berg Technology, Inc., Reno, Nev.

[21] Appl. No.: 315,439

[22] Filed: Sep. 30, 1994

[51] Int. Cl.[6] .................................................. H05K 1/14
[52] U.S. Cl. ........................ 361/737; 361/752; 361/799; 361/820; 257/679
[58] Field of Search ................................. 361/728, 752, 361/796, 799, 820, 737; 235/441, 486, 492, 479; 200/292, 505, 512, 517; 206/39.4, 39.6, 449; 220/348, 306, 345, 346, 326; 429/9, 97, 100; 257/679

[56] References Cited

U.S. PATENT DOCUMENTS

| | | | |
|---|---|---|---|
| 3,992,225 | 11/1976 | Sykes | 429/1 |
| 4,828,944 | 5/1989 | Yabe et al. | 429/97 |
| 5,019,468 | 5/1991 | Miyabayashi | 429/101 |
| 5,330,360 | 7/1994 | Marsh | 439/76 |
| 5,402,095 | 3/1995 | Janniere | 235/441 |

*Primary Examiner*—Leo P. Picard
*Assistant Examiner*—Y. Whang
*Attorney, Agent, or Firm*—Daniel J. Long; M. Richard Page

[57] ABSTRACT

Disclosed is a printed wiring board and memory card assembly comprising a pair of opposed cover plates, a printed wiring board interposed between the opposed cover plates, an electrical battery positioned adjacent the printed wiring board and between the opposed covers, a positive terminal connecting the printed wiring board with the battery and a negative terminal connecting the printed wiring board with the battery and both of the cover plates. A method of grounding the printed wiring board by this assembly is also disclosed.

27 Claims, 6 Drawing Sheets

MEMORY CARD ASSEMBLY HAVING IMPROVED MEANS FOR GROUNDING PRINTED WIRING BOARD AND METHOD OF USE

BACKGROUND OF THE INVENTION

1. Field of the Invention

The present invention relates to electrical connectors and more particularly to memory card assemblies.

2. Brief Description of Prior Developments

In printed wiring board and memory card assemblies, a printed wiring board is conventionally fixed at its rear edge to an elongated receptacle which is pivotally connected to a frame in which the printed wiring board rests. Above and below the frame there are metallic cover plates. It is necessary that the printed wiring board be grounded to each of these plates. To accomplish this grounding, a pair of small springs are conventionally soldered to the printed wiring board. Because of the small size of these springs and the difficulty in handling them, this spring soldering process is expensive and time consuming. A need, therefore, exists for an improved means of grounding the printed wiring board in memory card assemblies.

SUMMARY OF THE INVENTION

In the present invention, a printed wiring board is interposed between upper and lower opposed cover plates. An electrical battery is also positioned between these cover plates in a recess in the printed wiring board. The battery is disc-shaped and has a negative contact area on one of its planar surfaces and a positive contact area on its curved peripheral surface. A positive terminal extends from the printed wiring board to contact the peripheral positive electrode on the battery. A negative terminal is attached adjacent the front edge of the printed wiring board. This negative terminal has an upper section which extends to contact the top cover plate. The negative electrode also has a lower end which extends downwardly to contact the lower cover plate and then extends horizontally to contact the negative planar contact area on the battery.

BRIEF DESCRIPTION OF THE DRAWINGS

The printed wiring board and memory card assembly of the present invention is further described with reference to the accompanying drawings in which:

FIG. 6 is a cross sectional view similar to FIG. 5 except the position of a battery is shown;

DETAILED DESCRIPTION OF THE PREFERRED EMBODIMENT

Figure 1:
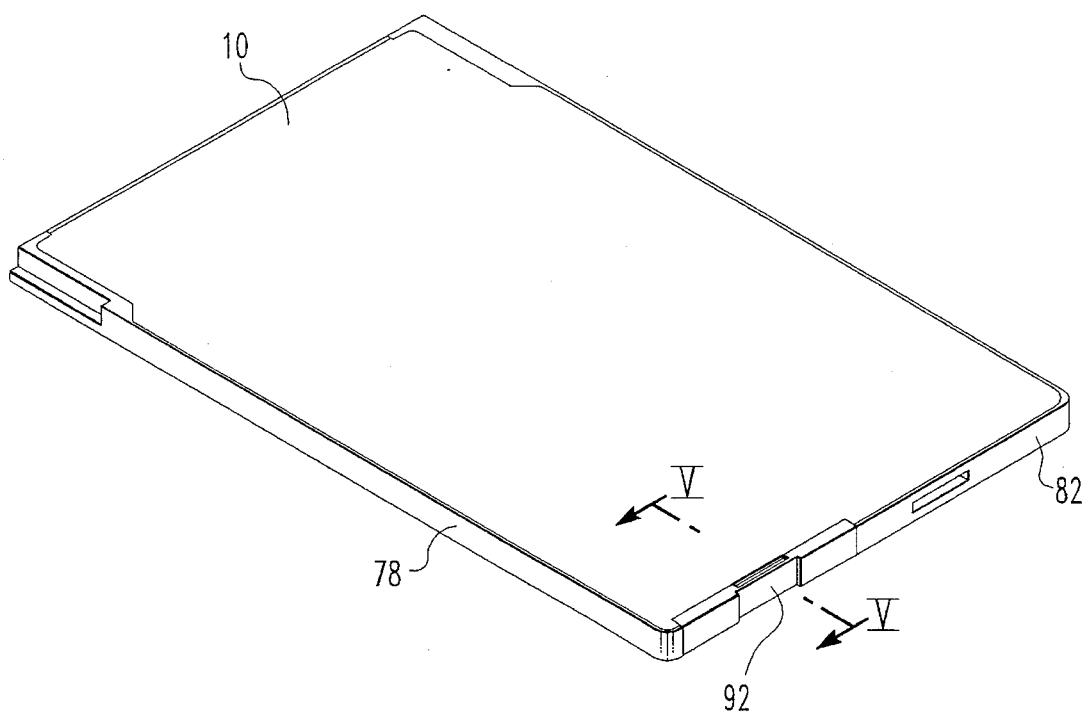
FIG. 1 is a perspective view of the printed wiring board and memory card assembly of the present invention.

Referring to the drawings, the printed wiring board and memory card assembly of the present invention includes a metallic upper cover plate 10, a metallic lower cover plate 12 between which there is positioned a printed wiring board shown generally at numeral 14. This printed wiring board has lateral edges 16 and 18, a front edge 20 and a rear edge 22 which is fixed to an elongated receptacle 24 by means of solder tails as at 26. As is conventional, on its reverse side the receptacle engages a header (not shown). The printed wiring board includes a first major recess 28 which has a transverse side 30 and a longitudinal side 32. It also includes a second minor recess 34 adjacent the major recess which has a transverse side 36 and a longitudinal side 38. A positive terminal 39 is fixed at its one end to the transverse edge of the major recess and extends into the recess to contact a battery when one is positioned there. A metallic negative terminal is shown generally at numeral 40 and includes an upper first section 42, a lower second section 44 and a medial attachment area 46 at which it is fixed by soldering to a grounding pad on the printed wiring board adjacent the front edge of the printed wiring board, generally, and more particularly adjacent the transverse side of the minor recess. The lower section of the negative terminal in particular includes a vertical section 48 which extends downwardly to a terminal edge 50 which then extends laterally in horizontal section 52 to a terminal edge 54. The structure continues in upwardly angled section 56 to apex 58 to a downwardly angled section 60. These upwardly and downwardly angled sections are divided in two prongs 62 and 64 which terminate in horizontal sections respectively at 66 and 68.

Figure 6:
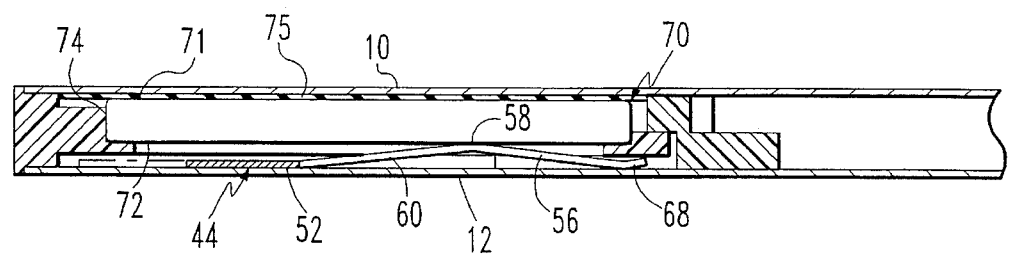
FIG. 6 is a detailed view of the area within circle 6 in FIG. 1.
Figure 7:
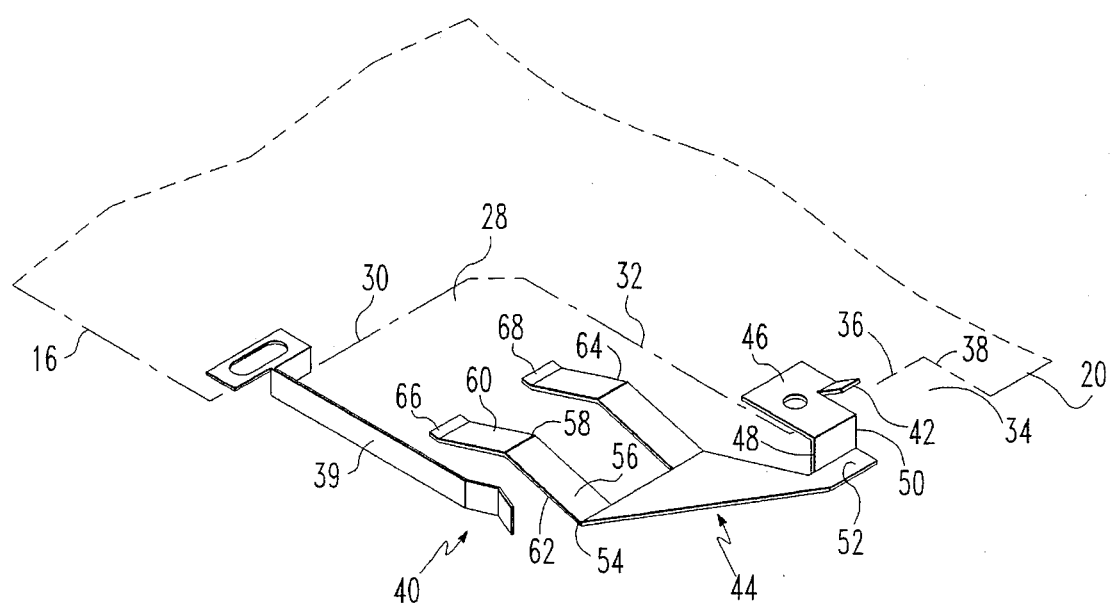
FIG. 7 is an enlarged view of the area in circle VII in FIG. 2.

Referring particularly to FIG. 6, the battery 70 has a planar upper side 71, a planar lower side 72 having a negative electrode, a peripheral edge 74 having a positive electrode 74. As is conventional, there is an insulative layer 75 on the lower side of the upper cover above the battery. When the battery is inserted into the assembly, the apex 58 on the negative terminal is in contact with the planar side negative electrode and the positive terminal is in contact with the peripheral positive electrode. A preferred battery for use in this assembly would be a PANASONIC CR 2025 3 volt lithium battery. It will be understood that for this type of battery the negative terminal will be positioned on the bottom planar side of the battery while the positive terminal will be positioned on the curved peripheral edge of the battery as well as on the planar top side.

Figure 2:
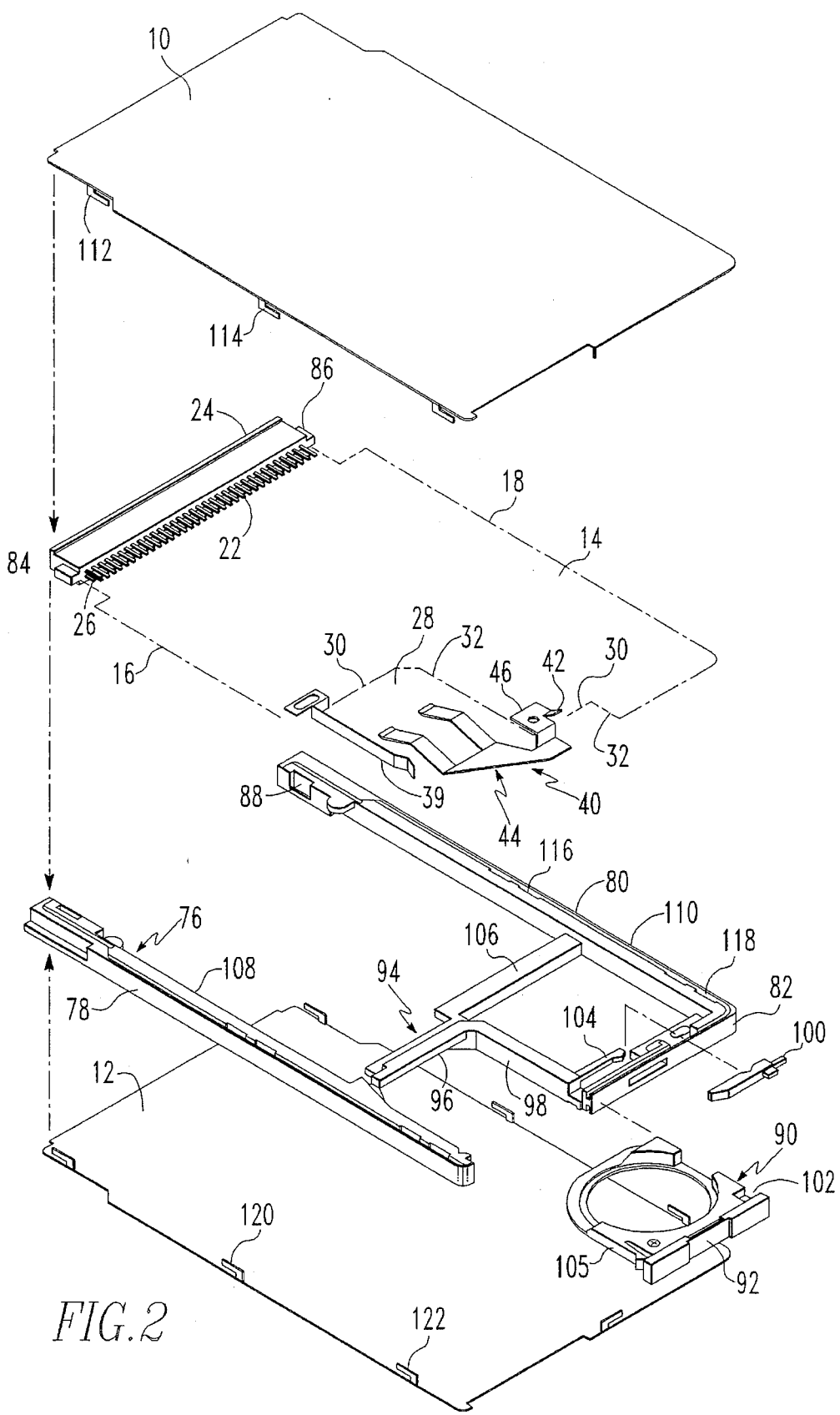
FIG. 2 is an exploded view of the assembly shown in FIG. 1.
Figure 3:
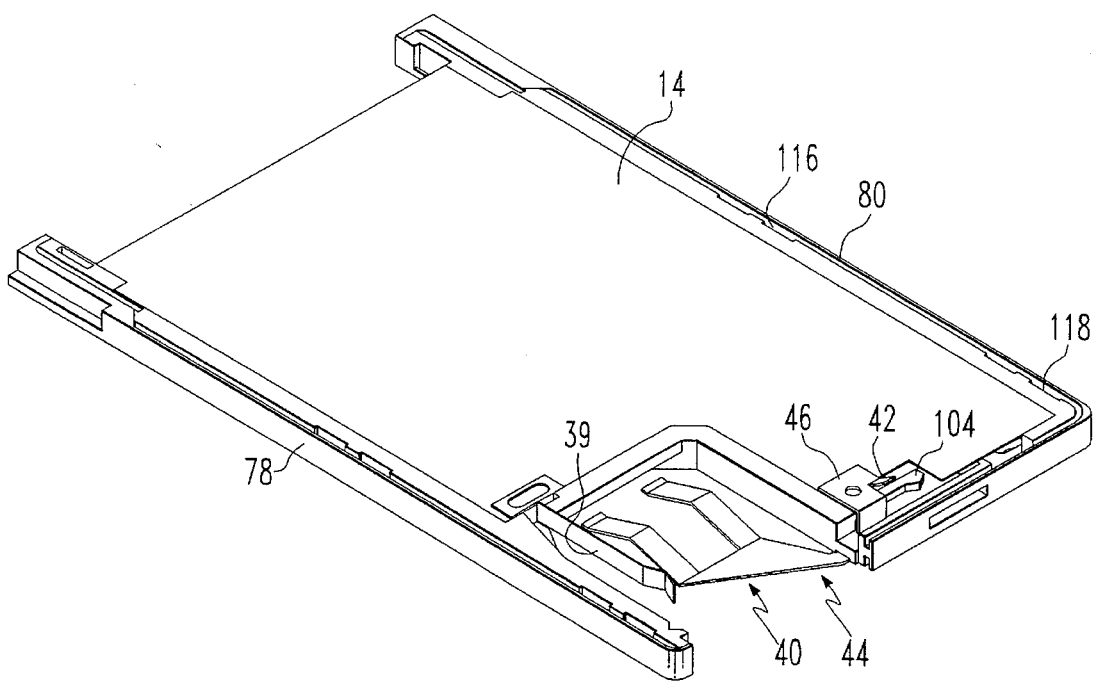
FIG. 3 is a perspective view similar to FIG. 1 in which the cover plates have been removed.
Figure 4:
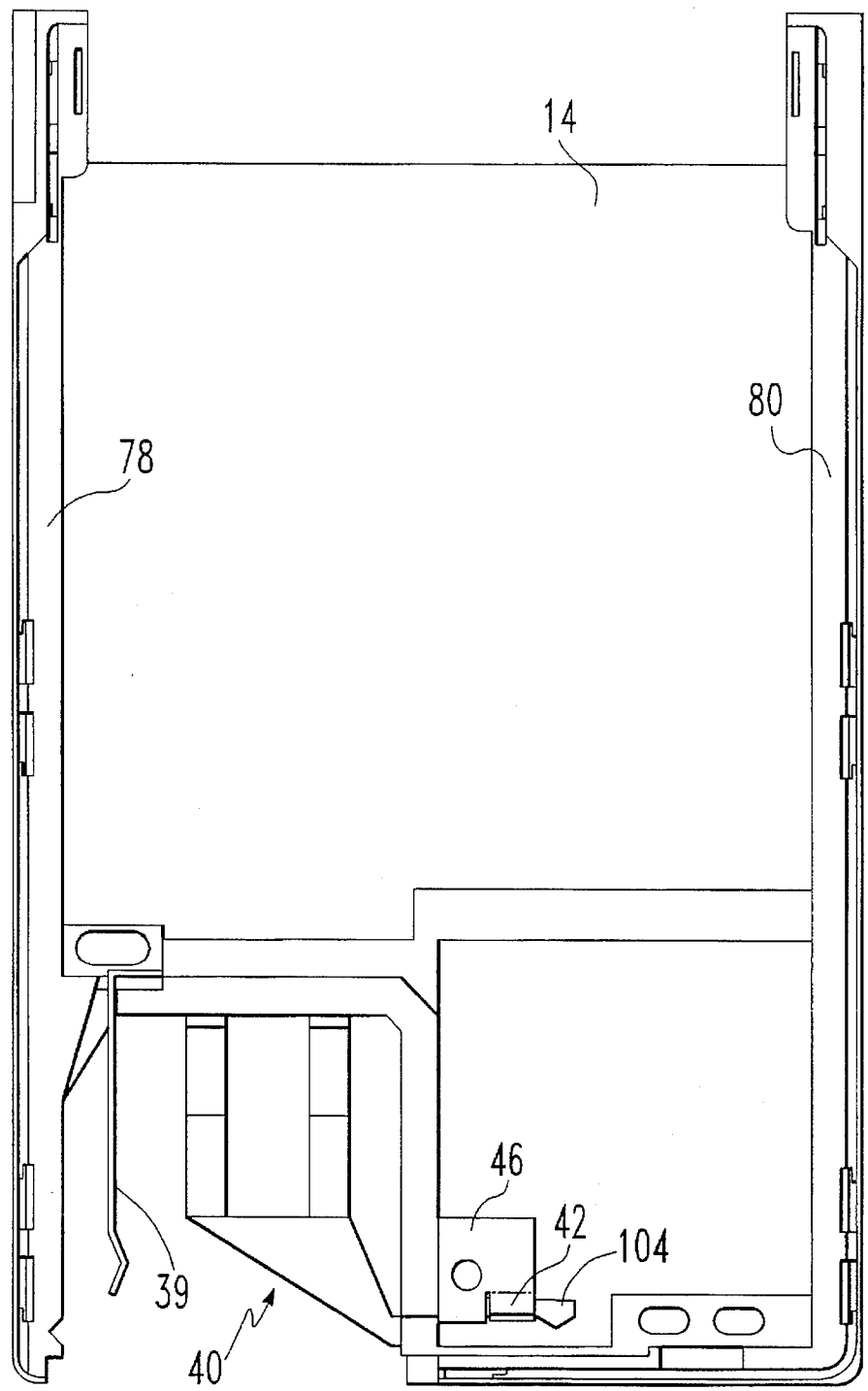
FIG. 4 is a top plan view of the assembly shown in FIG. 3 in which the cover plates have been removed.
Figure 5:
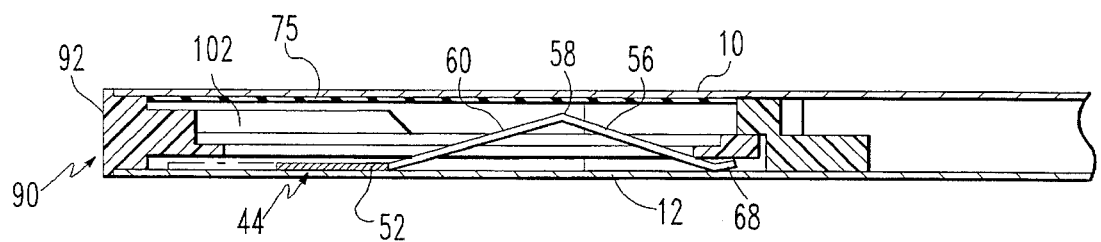
FIG. 5 is a cross sectional view through line V—V in FIG. 1
Figure 8:
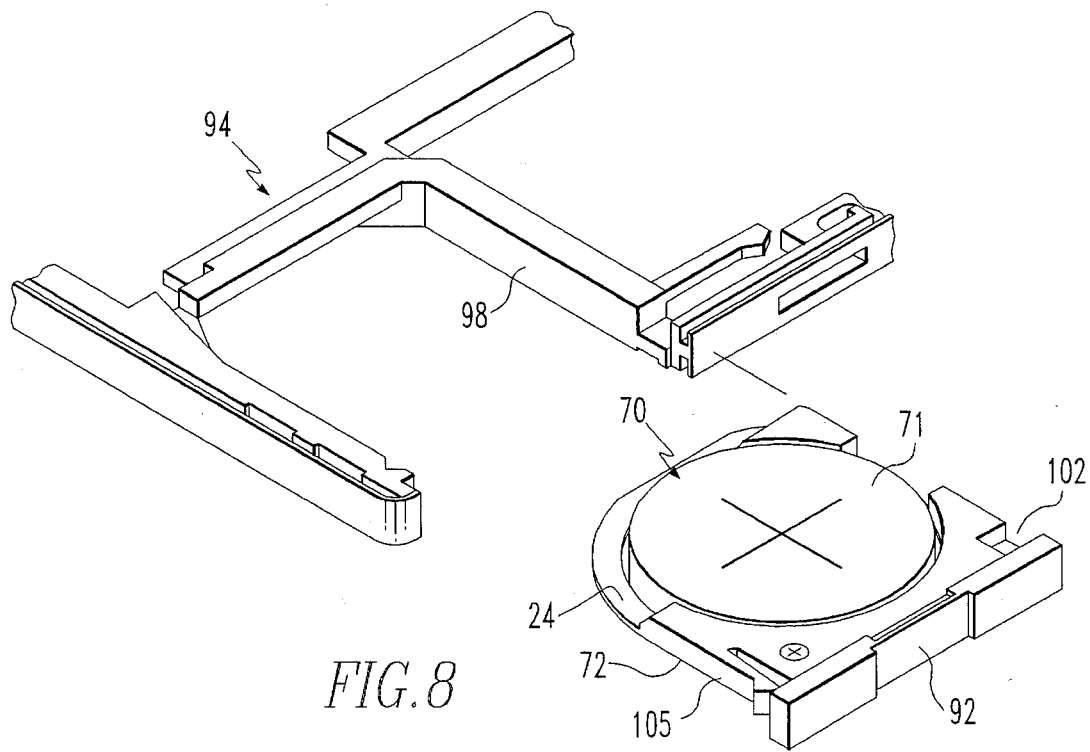
FIG. 8 is an enlarged view of the area in circle VII in FIG. 2 in which the position of a battery is shown.

The plastic frame is shown generally at numeral 76 and includes lateral bars 78 and 80 and a transverse front bar 82. Projections 84 and 86 on opposite ends of the receptacle engage recesses as at 88 in the lateral bars of the frame to allow for engagement between the receptacle and printed wiring board and the frame. The battery may be retained in battery retaining member 90 which includes a front section 92. The battery retaining member is engageable with a battery receiving structure 94 which includes a transverse bar 96 and a longitudinal bar 98. When the battery retaining member is engaged in this manner, its front section 92 is an integral section of the transverse front bar 82 of the frame. Referring again particularly to FIGS. 2 and 8, it will be seen that a slide lock 100 fits into groove 102 in the battery retaining member and adjacent clip 104 to lock the battery retaining member in position in the battery receiving structure. Another clip 105 locks the battery retaining member into lateral bar 78.

Again, it will seen referring to the drawings generally, that the frame also includes reinforcing bar 106 and that the lateral and front bars include a top face 108 and an outer peripheral ridge 110. In its assembled configuration, the printed wiring board is spaced vertically above the top face inwardly from this peripheral ridge. On the top cover plate there are a number of clips as at 112 and 114 which engage recesses as at 116 and 118 on the peripheral ridge to attach the top cover plate to the frame. Similarly, there are clips as at 120 and 122 on the lower cover plate which engage other recesses (not shown) to attach the lower cover plate to the frame.

It will be appreciated that since it uses a single grounding element which also services as a battery terminal, the printed wiring board in a memory card assembly of the present invention may be efficiently and cost effectively produced.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A printed wiring board and memory card assembly comprising:
   (a) a pair of opposed cover plates:
   (b) a printed wiring board interposed between said opposed cover plates;
   (c) an electrical power source comprising an electrical battery;
   (d) a positive terminal connecting the printed wiring board with the electrical power source;
   (e) a negative terminal connecting the printed wiring board with the power source and with both of the opposed cover plates wherein the opposed cover plates comprise a first cover plate and a second cover plate and the battery has a negative electrode and a positive electrode and the negative terminal has a first section and a second section and is fixed to the printed wiring board at an attachment area interposed between said first and second sections and said first section of said negative terminal extends from said attachment area to contact the first cover plate and said second section of the negative terminal extends from said attachment area to contact the second cover plate and the negative electrode of said battery and the second section of the negative terminal contacts the positive electrode of said battery.

2. The printed wiring board and memory card assembly of claim 1 wherein first cover is an upper cover plate and the second cover is a lower cover plate.

3. The printed wiring board and memory card assembly of claim 2 wherein the battery is disc shaped and has opposed planar surfaces and a peripheral surface perpendicularly interposed between said planar surfaces and the negative electrode is located on one of said opposed planar surfaces and the positive electrode is located at least in part on the peripheral surface.

4. The printed wiring board and memory card assembly of claim 3 wherein the first section of the negative terminal contacts the upper cover plate and the second section of the negative terminal extends downwardly to contact the lower cover plate and the negative electrode of the battery.

5. The printed wiring board and memory card assembly of claim 4 wherein one planar side of the battery is an upper side and one planar side of the battery is a lower side and the first contact area is on said lower side.

6. The printed wiring board and memory card assembly of claim 5 wherein the second section of the negative terminal first extends downwardly to contact the lower cover plate and then contacts the negative electrode of the battery.

7. The printed wiring board and memory card assembly of claim 6 wherein the second section of the negative terminal has a vertical section extending downwardly from the attachment area to a terminal edge; a horizontal section extending laterally to a terminal edge from the lower terminal edge of the vertical section and continuously abutting the lower cover plate; an upwardly angled section extending from the terminal edge of the horizontal section to an apex; and a downwardly angled section extending from the apex and terminating in a horizontal surface.

8. The printed wiring board and memory card assembly of claim 7 wherein the upwardly and downwardly angled sections are comprised of parallel prongs.

9. The printed wiring board and memory card assembly of claim 8 wherein the terminal contacts the negative electrode of the battery.

10. The printed wiring board and memory card assembly of claim 2 wherein the printed wiring board has a front end, a rear end and lateral sides and the attachment area of the negative terminal is adjacent the front end.

11. The printed wiring board and memory card assembly of claim 10 wherein the printed wiring board has a front recess adjacent its front end and one lateral side and the battery is positioned in said front recess.

12. The printed wiring board and memory card assembly of claim 11 wherein the recess has a transverse edge and a longitudinal edge and the positive terminal is attached adjacent the transverse edge.

13. The printed wiring board and memory card assembly of claim 12 wherein a second minor recess having a transverse edge and a longitudinal edge extends inwardly from the major recess adjacent the front edge of the printed wiring board.

14. The printed wiring board and memory card assembly of claim 13 wherein the negative terminal attachment area is adjacent the transverse edge of the second minor recess.

15. The printed wiring board and memory card assembly of claim 14 wherein the receptacle is pivotally connected to a frame member having a pair of lateral bars connected to a transverse front bar.

16. The printed wiring board and memory card assembly of claim 15 wherein the battery is housed in a battery retaining member positioned adjacent to the front bar and one of said lateral bars.

17. The printed wiring board and memory card assembly of claim 16 wherein the front bar of the frame is segmented into two sections joining end to end and the battery retaining member is integral with one of said sections.

18. The printed wiring board and memory card assembly of claim 17 wherein the frame includes a battery receiving structure.

19. The printed wiring board and memory card assembly of claim 18 wherein locking means are provided to retain the battery retaining member in the battery receiving structure.

20. The printed wiring board and memory card assembly of claim 15 wherein the frame includes a transverse reinforcing member.

21. The printed wiring board and memory card assembly of claim 15 wherein the frame has a top surface and an upwardly extending peripheral ridge and the printed wiring board lies on at least part of the top surface inside the peripheral ridge.

22. The printed wiring board and memory card assembly of claim 15 wherein attachment means connect the upper cover plate to the frame and the lower cover plate to the frame.

23. The printed wiring board and memory card assembly of claim 15 wherein the frame is plastic.

24. The printed wiring board and memory card assembly of claim 13 wherein the printed wiring board is fixed at its rear end to an elongated receptacle member.

25. The printed wiring board and memory card assembly of claim 1 wherein the cover plates are metallic.

26. The printed wiring board and memory card assembly of claim 1 wherein the terminals are metallic.

27. A method for grounding a printed wiring board in a printed wiring board and memory card assembly comprising the step of:

(a) positioning the printed wiring board and an electrical battery between a pair of opposed cover plates;

(b) connecting the printed wiring board to the battery by means of a positive terminal and a negative terminal such that the negative terminal also abuts both of the opposed cover plates wherein the opposed cover plates comprise a first cover plate and a second cover plate and the battery has a negative electrode and a positive electrode and the negative terminal has a first section and a second section and is fixed to the printed wiring board at an attachment area interposed between said first and second sections and said first section of said negative terminal extends from said attachment area to contact the first cover plate and said second section of the negative terminal extends from said attachment area to contact the second cover plate and the negative electrode of said battery and the second section of the negative terminal contacts the positive electrode of said battery.

* * * * *